(12) United States Patent
Kim

(10) Patent No.: US 10,903,459 B2
(45) Date of Patent: Jan. 26, 2021

(54) MASK ASSEMBLY, AND APPARATUS AND METHOD FOR MANUFACTURING DISPLAY APPARATUS INCLUDING THE MASK ASSEMBLY

(71) Applicant: SAMSUNG DISPLAY CO., LTD., Yongin-si (KR)

(72) Inventor: Yonghwan Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/534,363

(22) Filed: Aug. 7, 2019

(65) Prior Publication Data

US 2020/0075899 A1 Mar. 5, 2020

(30) Foreign Application Priority Data

Aug. 29, 2018 (KR) .................. 10-2018-0102175

(51) Int. Cl.
| | | |
|---|---|---|
| *H01L 51/56* | (2006.01) | |
| *H01L 51/00* | (2006.01) | |
| *C23C 14/04* | (2006.01) | |
| *H01L 27/32* | (2006.01) | |

(52) U.S. Cl.
CPC .......... *H01L 51/56* (2013.01); *C23C 14/042* (2013.01); *H01L 51/0011* (2013.01); *H01L 51/0021* (2013.01); *H01L 27/3244* (2013.01)

(58) Field of Classification Search
CPC ... H01L 51/0011; C23C 14/04; C23C 14/042; C23C 14/044
See application file for complete search history.

(56) References Cited

U.S. PATENT DOCUMENTS

| 7,572,338 B2 | 8/2009 | Kim et al. |
| 9,496,317 B2 | 11/2016 | Choi et al. |
| 2014/0116337 A1 | 5/2014 | Kim |
| 2017/0130321 A1* | 5/2017 | Mizumura ............. C25D 5/022 |
| 2017/0222145 A1* | 8/2017 | Kim .................... H01L 51/0011 |
| 2018/0198067 A1 | 7/2018 | Kim et al. |

FOREIGN PATENT DOCUMENTS

| EP | 1 536 497 A2 | 6/2005 |
| EP | 1 609 879 A1 | 12/2005 |
| JP | 2008-41327 A | 2/2008 |
| KR | 10-0626041 B1 | 9/2006 |
| KR | 10-2014-0053625 A | 5/2014 |
| KR | 10-2015-0073743 A | 7/2015 |
| KR | 10-2015-0111780 A | 10/2015 |
| KR | 10-2018-0041294 A | 4/2018 |

OTHER PUBLICATIONS

EPO Partial Search Report dated Jan. 24, 2020, for corresponding European Patent Application No. 19189420.3 (15 pages).
Extended European Patent Search Report for corresponding European Patent Application No. 19189420.3, dated May 29, 2020, 17 pages.

* cited by examiner

*Primary Examiner* — John P. Dulka
(74) *Attorney, Agent, or Firm* — Lewis Roca Rothgerber Christie LLP

(57) ABSTRACT

A mask assembly includes a mask frame, a mask on the mask frame and including at least one opening through which a deposition material passes, and a stick on the mask frame and extending over the opening, wherein the stick includes a stick body portion connected to the mask frame and extending over the opening, and a protrusion protruding from the stick body portion toward the opening.

24 Claims, 7 Drawing Sheets

MASK ASSEMBLY, AND APPARATUS AND METHOD FOR MANUFACTURING DISPLAY APPARATUS INCLUDING THE MASK ASSEMBLY

CROSS-REFERENCE TO RELATED APPLICATION

Korean Patent Application No. 10-2018-0102175, filed on Aug. 29, 2018, in the Korean Intellectual Property Office, and entitled: "Mask Assembly, and Apparatus and Method for Manufacturing Display Apparatus Including the Mask Assembly," is incorporated by reference herein in its entirety.

BACKGROUND

1. Field

Embodiments relate to a mask assembly, and an apparatus and method for manufacturing a display apparatus including the mask assembly.

2. Description of the Related Art

Applications of display apparatuses have diversified. Additionally, due to their relatively small thickness and light weight, their range of applications has increased.

The area occupied by display areas of display apparatuses has been increased, and also various functions that may be applied or linked to a display apparatus have been added.

SUMMARY

Embodiments are directed to a mask assembly, including a mask frame, a mask on the mask frame and including at least one opening through which a deposition material can pass, and a stick on the mask frame and extending over the opening, the stick including a stick body portion connected to the mask frame and extending over the opening, and a protrusion protruding from the stick body portion toward the opening.

The stick body portion and the protrusion may be separable from each other.

The protrusion may include a connection portion connected to the stick body portion, and a shielding portion connected to the connection portion and configured to shield the deposition material.

An end of the protrusion may be arranged farther from a source, which is configured to spray the deposition material, than one side of the mask that faces the source.

The mask and at least a portion of the stick may include different materials from each other.

At least a portion of the stick may be a non-magnetic material.

A hole may be in a portion of the stick body portion that corresponds to the protrusion.

The mask frame, the stick, and the mask may be sequentially stacked.

Embodiments are also directed to an apparatus for manufacturing a display apparatus, the apparatus including a chamber to accommodate a display substrate, a mask assembly positioned to face the display substrate, and a source facing the mask assembly and configured to supply a deposition material to the display substrate. The mask assembly may include a mask frame, a mask on the mask frame and including at least one opening through which the deposition material can pass, and a stick on the mask frame and extending over the opening, and the stick may include a stick body portion connected to the mask frame and extending over the opening, and a protrusion protruding from the stick body portion toward the opening.

The stick body portion and the protrusion may be separable from each other.

The protrusion may include a connection portion connected to the stick body portion, and a shielding portion connected to the connection portion and configured to shield the deposition material.

An end of the protrusion may be arranged farther from a source, which is configured to spray the deposition material, than one side of the mask that faces the source.

The mask and at least a portion of the stick may include different materials from each other.

At least a portion of the stick may be a non-magnetic material.

A hole may be in a portion of the stick body portion that corresponds to the protrusion.

The mask frame, the stick, and the mask may be sequentially stacked.

Embodiments are also directed to a method of manufacturing a display apparatus, the method including arranging a display substrate and a mask assembly within a chamber, aligning the display substrate with the mask assembly, and supplying a deposition material from a source, passing the deposition material through the mask assembly, and supplying the deposition material to the display substrate. The deposition material may be blocked by a certain area while passing through an opening of the mask assembly to form an opening area in the display substrate, and is deposited on a display area of the display substrate except for the opening area.

The mask assembly may include a protrusion that corresponds to the opening area and protrudes toward the display substrate.

The protrusion may be in contact with the display substrate.

The deposition material may form at least one of at least a portion of an intermediate layer of the display substrate, and an opposite electrode.

Embodiments are also directed to a method of manufacturing a display apparatus, the method including arranging a display substrate and a mask assembly within a chamber, aligning the display substrate with the mask assembly, and supplying a deposition material from a source, passing the deposition material through the mask assembly, and supplying the deposition material to the display substrate. The mask assembly may include a mask frame, a mask on the mask frame and including at least one opening through which the deposition material passes, and a stick on the mask frame and extending over the opening, and the stick may include a stick body portion connected to the mask frame and extending over the opening, and a protrusion protruding from the stick body portion toward the opening.

An end of the protrusion may be arranged farther from the source than one side of the mask that faces the source.

The mask and at least a portion of the stick may include different materials.

At least a portion of the stick may be a non-magnetic material.

BRIEF DESCRIPTION OF THE DRAWINGS

Features will become apparent to those of skill in the art by describing in detail example embodiments with reference to the attached drawings in which.

DETAILED DESCRIPTION

Figure 1:
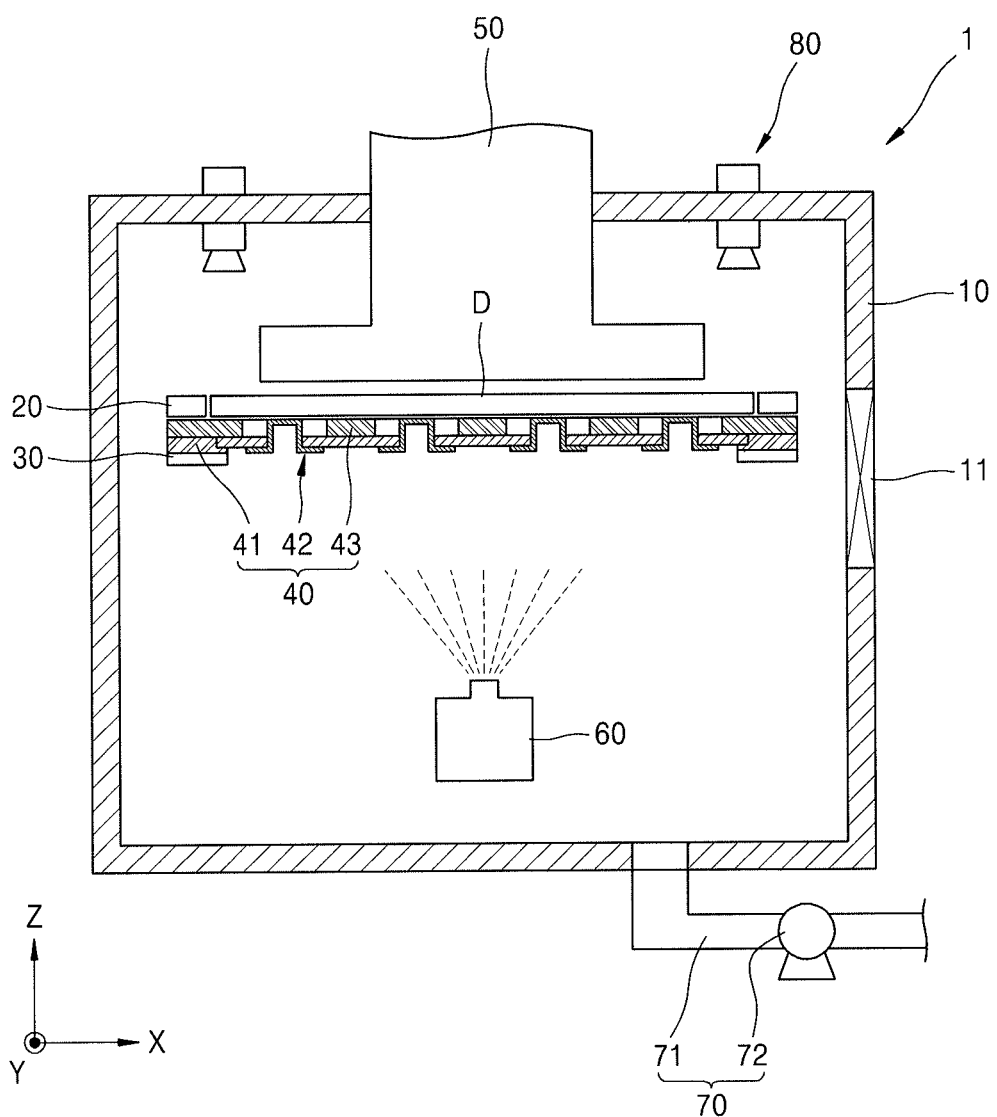
FIG. 1 illustrates a cross-sectional view of an apparatus for manufacturing a display apparatus, according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

When a certain embodiment may be implemented differently, a specific process order may be performed differently from the described order. For example, two consecutively described processes may be performed substantially at the same time or performed in an order opposite to the described order.

It will also be understood that when a layer, region, or component is referred to as being "connected" or "coupled" to another layer, region, or component, it can be directly connected or coupled to the other layer, region, or component or intervening layers, regions, or components may be present. For example, when a layer, region, or component is referred to as being "electrically connected" or "electrically coupled" to another layer, region, or component, it can be directly electrically connected or coupled to the other layer, region, or component or intervening layers, regions, or components may be present.

Figure 2:
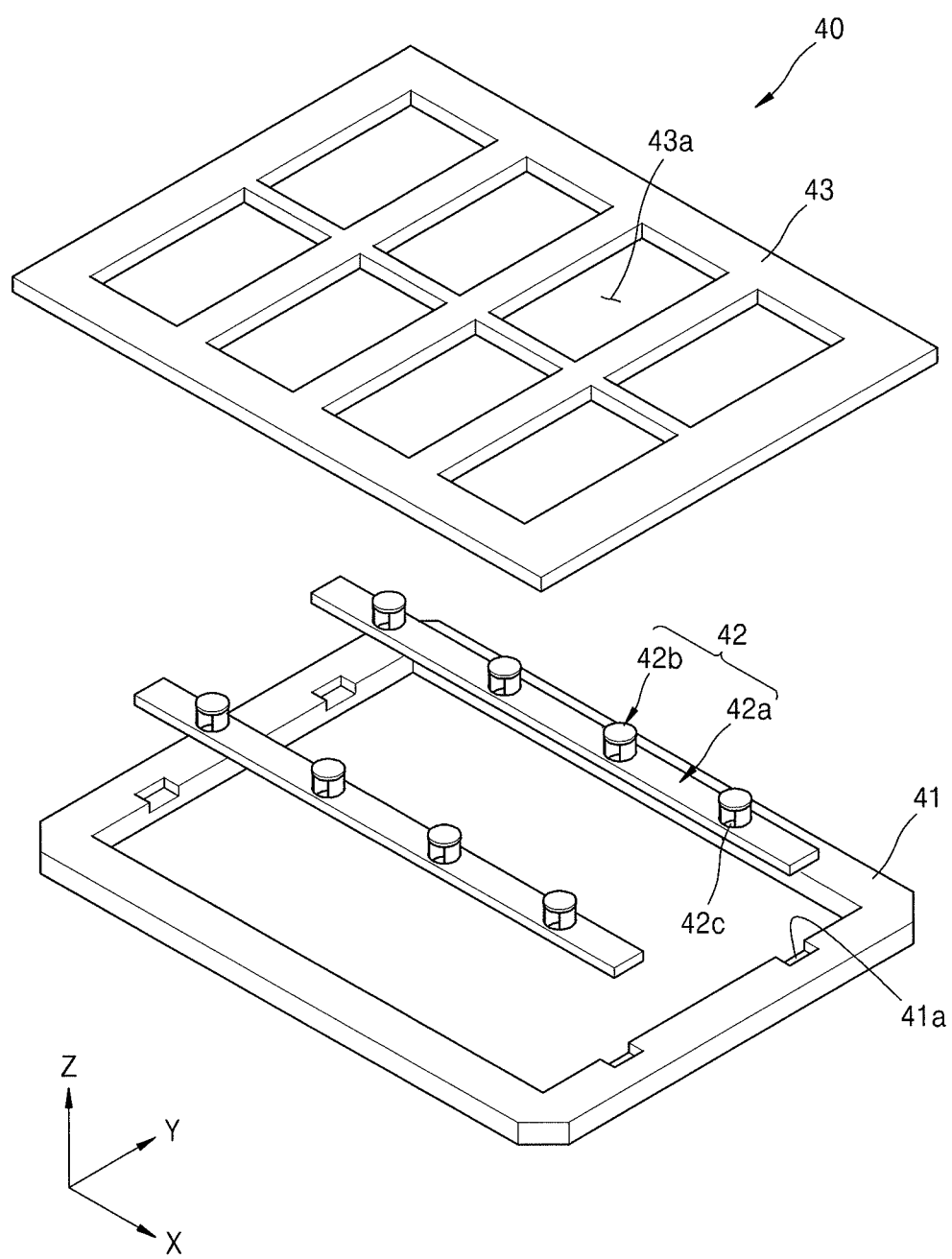
FIG. 2 illustrates a perspective view of a mask assembly illustrated in FIG. 1.
Figure 3:
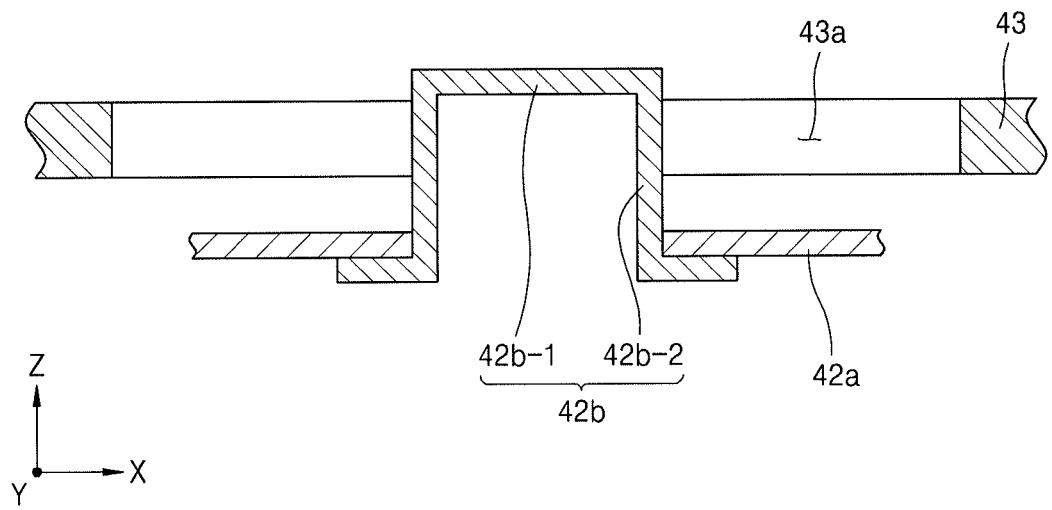
FIG. 3 illustrates a cross-sectional view of a mask and a stick illustrated in FIG. 2.
Figure 4:
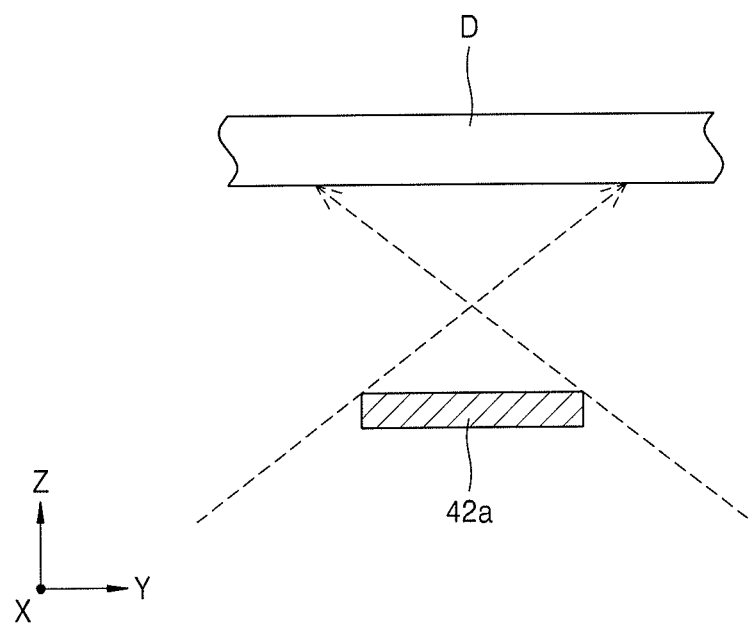
FIG. 4 illustrates a cross-sectional view of deposition, onto a display substrate, of a deposition material having passed through the stick of FIG. 3.

FIG. 1 is a cross-sectional view of an apparatus 1 for manufacturing a display apparatus, according to an example embodiment. FIG. 2 is a perspective view of a mask assembly 40 illustrated in FIG. 1. FIG. 3 is a cross-sectional view illustrating a mask 43 and a stick 42 illustrated in FIG. 2. FIG. 4 is a cross-sectional view illustrating deposition of a deposition material having passed through the stick 42 of FIG. 3 on a display substrate D.

Referring to FIGS. 1 through 4, the apparatus 1 may include a chamber 10, a first support 20, a second support 30, the mask assembly 40, a magnetic force generator 50, a source 60, a pressure adjuster 70, and a vision unit 80.

The chamber 10 may have a space formed therein, and deposition may be performed in the space. An open portion may be formed in the chamber 10, and a gate valve 11 may be arranged in the open portion to close or open the open portion.

The first support 20 may be arranged in the chamber 10 and may support the display substrate D. The first support 20 may have various shapes. For example, the first support 20 may be fixed to inside of the chamber 10, and the display substrate D may be seated on the first support 20. According to another example embodiment, the first support 20 may include a shuttle that is linearly movable within the chamber 10. According to another example embodiment, the first support 20 may have a clamp shape that is arranged in the chamber 10 and holds the display substrate D. According to another example embodiment, the first support 20 may be arranged in the chamber 10, and may include, for example, an electrostatic chuck or an adhesive chuck that fixes the display substrate D. The first support 20 may include any of devices and structures that support the display substrate D. For convenience of description, a case where the first support 20 is fixed to the inside of the chamber 10 and the display substrate D is safely seated on the first support 20 will now be described in detail.

The mask assembly 40 may be arranged on the second support 30 and may be supported by the second support 30. In this case, the second support 30 may adjust a location of the mask assembly 40. For example, the second support 30 may raise and lower or rotate the mask assembly 40 by a certain distance, and also may linearly move the mask assembly 40 in a direction.

The mask assembly 40 may selectively transmit a deposition material. The mask assembly 40 may include one or more openings 43a. For example, according to an example embodiment, the mask assembly 40 may include an opening 43a that transmits the deposition material. A deposition material that has passed through the opening 43a may be deposited on an area of the display substrate D and thus may form a display area. According to another example embodiment, the mask assembly 40 may include a plurality of openings 43a that transmit the deposition material. In this case, the display substrate D may be divided into a plurality of areas, and a deposition material that has passed through each of the openings 43a may be deposited on each of the areas of the display substrate D and thus may form a display area in each of the areas. For example, in this case, the areas of the display substrate D may be separated from each other after the deposition material is deposited, and thus the single display apparatus may be manufactured. For convenience of description, a case where the mask assembly 40 includes a plurality of openings 43a will now be described in detail.

The mask assembly 40 may include a mask frame 41, a stick 42, and a mask 43. The mask frame 41 may have a space in a center area thereof. The mask frame 41 may have a shape, such as a window frame. The mask frame 41 may include seating grooves 41a onto and on which the stick 42 is inserted and seated. Each of the seating grooves 41a may be formed to be indented from an external surface of the mask frame 41, and thus a portion of the stick 42 may be completely inserted onto the seating groove 41a.

The stick 42 may be arranged on one side of the mask frame 41. The stick 42 may include a stick body portion 42a and a protrusion 42b.

The stick body portion 42a may extend in a lengthwise direction (for example, an X-axis direction of FIG. 2 (as shown) or a Y-axis direction of FIG. 2) of the mask frame 41. At least a portion of the stick body portion 42a may be arranged to be overlapped by the openings 43a. Thus, the stick body portion 42a may be arranged to extend over the openings 43a. An end of the stick body portion 42a may be inserted onto and seated on a seating groove 41a of the mask frame 41. The stick body portion 42a may be coupled to the mask frame 41 via, for example, welding or by using a screw, a bolt, or the like. The stick body portion 42a may have holes 42c formed therein. The holes 42c may be formed to correspond to protrusions 42b of the stick 42, which will be described below.

The protrusions 42b may be arranged on the stick body portion 42a such as to protrude toward the display substrate D. The protrusions 42b may be inserted into the holes 42c and may be connected to the stick body portion 42a. The protrusions 42b may be integrally formed with the stick body portion 42a or may be formed separate from the stick body portion 42a. For convenience of description, a case where the protrusions 42b and the stick body portion 42a are detachable from each other and are coupled to each other will now be described in detail. Each of the protrusions 42b may include a connection portion 42b-2 that is connected to the stick body portion 42a, and a shielding portion 42b-1 that is connected to the connection portion 42b-2. The connection portion 42b-2 may be arranged to penetrate a hole 42c of the stick body portion 42a, and a portion of the connection portion 42b-2 may be bent and seated on one side of the stick body portion 42a. The bent portion of the connection portion 42b-2 may be fixed to the one side of the stick body portion 42a via, for example, welding or the like. The shielding portion 42b-1 may be arranged apart from the stick body portion 42a. The shielding portion 42b-1 may be formed to correspond to the shape of a first opening area, which will be described below. For example, when the first opening area to be formed is circular, the shielding portion 42b-1 may be formed to have a circle shape. According to another example embodiment, when the first opening area to be formed is polygonal, the shielding portion 42b-1 may be formed to have a polygon shape. The shielding portion 42b-1 may be formed to correspond to the shape of the first opening area according to the shape of the first opening area. One side of the shielding portion 42b-1 (or an end of the protrusion 42b) may be arranged farther from the source 60 than the one side of the stick body portion 42a that contacts the bent portion of the connection portion 42b-2. In this case, at least a portion of the shielding portion 42b-1 may be arranged within an opening 43a or outside of the opening 43a. For example, the shielding portion 42b-1 may be arranged to further protrude toward the display substrate D than the mask 43 protrudes.

The protrusion 42b may have any shape that is connected to the stick body portion 42a and includes the shielding portion 42b-1 to shield a deposition material to prevent deposition of the deposition material on a portion of the display area of the display substrate D.

The mask 43 may be arranged on the mask frame 41. The mask 43 may include a plurality of openings 43a arranged to correspond to the areas of the display substrate D, respectively. Each of the openings 43a may have a shape that corresponds to a display area of each area of the display substrate D. The deposition material that has passed through each opening 43a may be deposited on each area of the display substrate D and thus may form the display area.

One mask 43 or a plurality of masks 43 may be included. When a plurality of masks 43 is included, the plurality of masks 43 may each be formed to have a plate shape and may be arranged on the mask frame 41 to be adjacent to each other. For convenience of description, a case where one mask 43 is formed will now be described in detail.

The magnetic force generator 50 may be arranged in the chamber 10 and thus may force the mask assembly 40 to be closer toward the display substrate D. In this case, the magnetic force generator 50 may include at least one of a magnet and an electromagnet that generate magnetic forces.

The source 60 may store the deposition material, and may sublime or vaporize the deposition material. The source 60 may include a heater to heat the deposition material. The source 60 may further include a crucible to store the deposition material. The source 60 may stand still within the chamber 10 or may linearly move or reciprocate in one direction within the chamber 10. When the source 60 moves, the chamber 10 may include a source driving unit that drives the source 60 to linearly move and reciprocate. In this case, the source driving unit may include a linear motor. For convenience of description, a case where the source 60 is fixed within the chamber 10 will now be described in detail.

The vision unit 80 may be arranged within the chamber 10 and may image or photograph at least one of the display substrate D and the mask assembly 40. The display substrate D and the mask assembly 40 may be arranged based on data obtained by imaging conducted by the vision unit 80.

The pressure adjuster 70 may be connected to the chamber 10 and may adjust an internal pressure of the chamber 10. The pressure adjuster 70 may include a guide pipe 71 connected to the chamber 10, and a vacuum pump 72 provided on the guide pipe 71 to adjust the internal pressure of the chamber 10. In this case, according to an operation of the vacuum pump 72, gas may be discharged from the chamber 10, or special gas may be supplied into the chamber 10.

When the apparatus 1 manufactures a display apparatus, the display substrate D may be arranged within the chamber 10. In this case, the mask assembly 40 may be arranged within the chamber 10.

The display substrate D may be arranged on the first support 20, and the mask assembly 40 may be arranged on the second support 30.

When the display substrate D and the mask assembly 40 are arranged as described above, an alignment mark of the display substrate D and the alignment mark of the mask assembly 40 are photographed by the vision unit 80 and compared with each other, and accordingly the display substrate D and the mask assembly 40 may be aligned. In this case, the second support 30 may precisely adjust the location of the mask assembly 40.

The magnetic force generator 50 may apply a magnetic force to the mask assembly 40. In this case, at least a portion of the stick 42 may be formed of a different material from that used to form the mask 43. For example, at least a portion of the stick 42 may include a non-magnetic material and the mask 43 may include a magnetic material. For example, at least a portion of the stick 42 may include non-magnetic stainless steel. For example, the protrusion 42*b* of the stick 42 may be formed of a non-magnetic material. The mask 43 may include, for example, an iron-nickel alloy (Invar alloy). For convenience of description, a case where the entire stick 42 is formed of stainless steel will now be described in detail.

When the magnetic force generator 50 applies a magnetic force as described above, the mask assembly 40 may move toward the display substrate D. In this case, the mask frame 41 may be formed of a magnetic material, the same as or similar to the mask 43.

The shielding portion 42*b*-1 may completely adhere to the display substrate D and thus may contact one side of the display substrate D. A portion of the mask 43 may also adhere to the display substrate D.

The source 60 may operate to supply the deposition material into the chamber 10. At this time, the deposition material may pass through the openings 43*a* and may be deposited on the display substrate D. In this case, a deposition material that has passed through the openings 43*a* may be deposited on a display area of the display substrate D.

In the above case, a portion of the display substrate D may be exposed via the openings 43*a*, and the other portion of the display substrate D may not be exposed due to a portion of the mask 43 having no openings 43*a* formed therein and the shielding portion 42*b*-1. Accordingly, the deposition material may be deposited on the exposed portion of the display substrate D.

While the deposition material is being deposited as described above, the deposition material may also be blocked by the stick body portion 42*a* and the connection portion 42*b*-2. However, because the deposition material sprayed by the source 60 is incident upon the display substrate D at various angles, a portion of the deposition material may be blocked by the stick body portion 42*a*, but another portion of the deposition material that does not collide with the stick body portion 42*a* may be deposited on a portion of the display substrate D that is opposite to the stick body portion 42*a*. Similar to the stick body portion 42*a*, a deposition material that has avoided the connection portion 42*b*-2 may be deposited on the display substrate D. Thus, even when the stick body portion 42*a* and the connection portion 42*b*-2 are arranged, the deposition material may be deposited on the display area of the display substrate D. In this case, the stick body portion 42*a* may be arranged somewhat apart from the display substrate D and thus may not disturb deposition of the deposition material on the portion of the display substrate D that faces the stick body portion 42*a*.

When the deposition material is deposited as described above, because the shielding portion 42*b*-1 completely adheres to the display substrate D as described above, the deposition material may not be deposited on a portion of the display substrate D that faces the shielding portion 42*b*-1. Accordingly, the deposition material may be uniformly deposited on a remaining area of the display area of the display substrate D except for the shielding portion 42*b*-1.

While the above-described operation is being conducted, the vacuum pump 72 may operate to discharge gas from the chamber 10.

When the above-described process is completed, the mask assembly 40 may be led out to the outside of the chamber 10. At this time, the vacuum pump 72 may operate to adjust the internal pressure of the chamber 10 to be the same as or similar to an atmospheric pressure.

Thereafter, the display substrate D may be discharged to the outside of the chamber 10. After a new display substrate D is inserted into the chamber 10, the above-described process may be repeated. In the display substrate D on which the deposition material has been deposited as described above, a hole may be formed in the first opening area via application of laser or mechanical abrasion, and thus a second opening area may be formed. The first opening area and the second opening area may be integrally formed with each other and may communicate with each other. In addition, the second opening area formed later than the first opening area may be formed to be smaller than the first opening area.

When the above-described process is completed, a thin film encapsulation layer may be formed on the display substrate D on which the deposition material has been deposited.

Thus, in the apparatus 1 for manufacturing a display apparatus and a method of manufacturing a display apparatus, a display apparatus having an opening area formed therein may be manufactured. Moreover, in the apparatus 1 for manufacturing a display apparatus and the method of manufacturing a display apparatus, deposition of the deposition material in the opening area may be prevented by a simple structure, and thus generation of a foreign material during formation of the opening area may be minimized.

Figure 5:
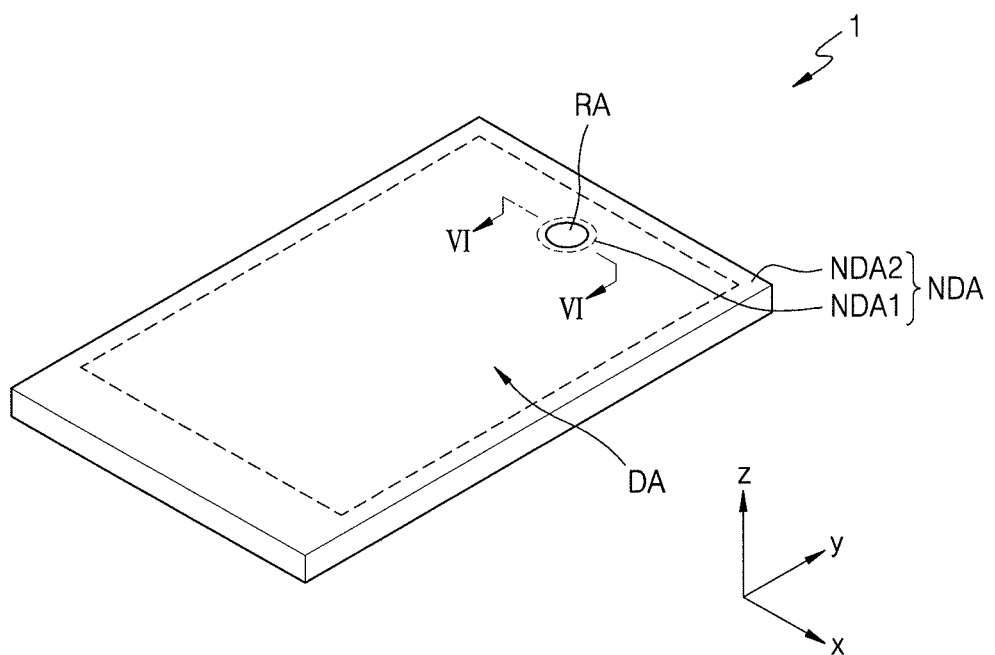
FIG. 5 illustrates a perspective view of a display apparatus manufactured by the apparatus of FIG. 1.
Figure 6:
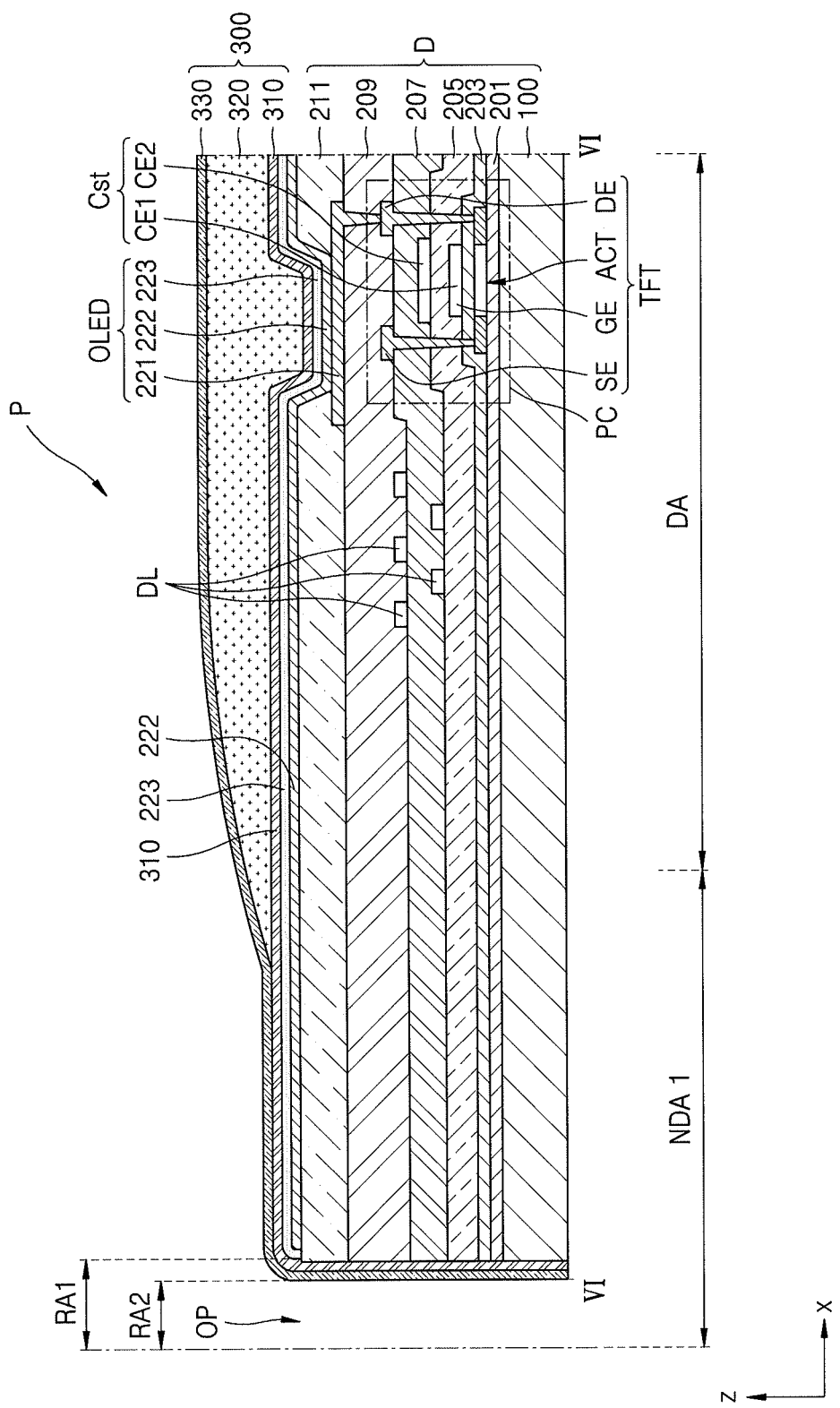
FIG. 6 illustrates a cross-sectional view taken along line VI-VI of FIG. 5.
Figure 7:
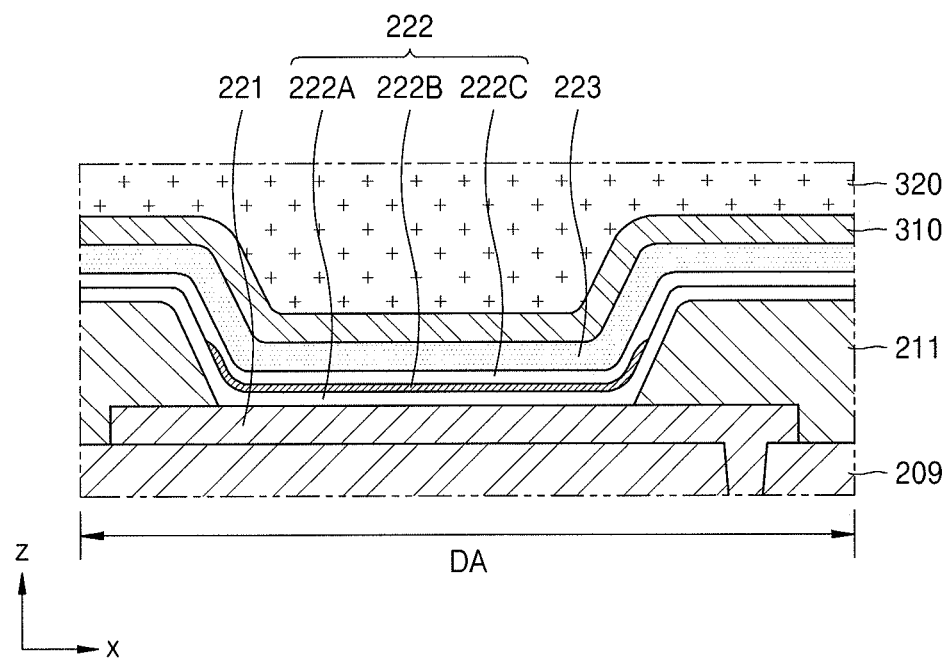
FIG. 7 illustrates a magnified cross-sectional view of an organic light-emitting diode (OLED) illustrated in FIG. 6.

FIG. 5 is a perspective view of a display apparatus manufactured by the apparatus 1 of FIG. 1. FIG. 6 is a cross-sectional view taken along line VI-VI of FIG. 5. FIG. 7 is a magnified cross-sectional view of an organic light-emitting diode (OLED) illustrated in FIG. 6.

Referring to FIGS. 5 through 7, a display apparatus may include a display panel P and an electronic element corresponding to an opening area RA of the display panel P. The opening area RA may be the same as a second opening area RA2. Although not shown, a component(s), such as at least one of an input sensing member for sensing a touch input, a reflection preventing member including both a polarizer and a retarder or both a color filter and a black matrix, and a transparent window, may be arranged on the display panel P. In this case, the electronic element may be arranged within an opening OP that will be described below, or may be arranged outside the opening OP.

The display panel P may include a substrate 100, a display element layer disposed on the substrate 100 and including display elements, and a thin-film encapsulation layer 300 as an encapsulation member that covers the display element layer.

The substrate 100 may be formed of a transparent glass material containing $SiO_2$ as a main component. The display element layer includes display elements, such as an OLED arranged in a display area DA. The display element layer may include a circuit and wires electrically connected to the OLED. The thin-film encapsulation layer 300 may cover the display element layer to thereby prevent infiltration of external moisture or external contaminating materials into the display element layer. The thin-film encapsulation layer 300 may include, for example, at least one inorganic encapsulation layer and at least one organic encapsulation layer.

The display panel P may include an opening OP that corresponds to the opening area RA and penetrates the display panel P. Openings corresponding to respective opening areas RA of the substrate 100, the display element layer, and the thin-film encapsulation layer 300 may form the opening OP of the display panel P.

The opening area RA may be a location where the electronic element is arranged, and thus the electronic element may be arranged to correspond to respective openings of the substrate 100, the display element layer, and the thin-film encapsulation layer 300. The opening of the substrate 100 may be formed to penetrate an upper surface and a lower surface of the substrate 100, the opening of the display element layer may be formed to penetrate from a lowermost layer of the display element layer to an uppermost layer thereof, and the opening of the thin-film encapsulation layer 300 may be formed to penetrate the thin-film encapsulation layer 300. According to another example embodiment, the opening of the thin-film encapsulation layer 300 may be formed by forming the opening of the display element layer and then forming the thin-film encapsulation layer 300 on the inner surface of the opening of the display element layer.

The electronic element may be an electronic element that uses light and/or sound. For example, the electronic element may include, for example, a sensor that receives and uses light, like an infrared sensor, a camera that receives light and captures an image, a sensor that outputs and senses light or sound to measure a distance or recognize a fingerprint or the like, a small lamp that outputs light, or a speaker that outputs sound. An electronic element using light may use light in various wavelength bands, such as visible light, infrared light, and ultraviolet light.

The opening area RA may be understood as a transmission area capable of transmitting light or/and sound that is output from the electronic element to the outside or travels from the outside toward the electronic element. For example, when a portion of the display panel P corresponding to the opening area RA is completely removed, for example, when the opening OP penetrates the display panel P, light or sound output or received by the electronic element may be more effectively used.

In an example embodiment, the display element layer and the thin-film encapsulation layer 300 may respectively include openings corresponding to the opening area RA, and the substrate 100 may not include openings. In this case, although the substrate 100 does not include openings, the display element layer and the thin-film encapsulation layer 300 may include openings, respectively, and thus transmittance of light and/or sound that the electronic element uses may be secured.

According to an example embodiment, a light transmittance in the opening area RA of the display panel P may be about 50% or greater, 70% or greater, 75% or greater, 80% or greater, 85% or greater, or 90% or greater.

According to another example embodiment, the substrate 100 of the display panel P may include polymer resin. In this case, the substrate 100 may secure greater flexibility than a substrate formed of a glass material. For example, the substrate 100 may include a first base layer, a first inorganic layer, a second base layer, and a second inorganic layer sequentially stacked thereon.

The first and second base layers may include transparent polymer resin. The transparent polymer resin may be, for example, polyethersulphone (PES), polyacrylate (PAR), polyetherimide (PEI), polyethylene naphthalate (PEN), polyethyelene terephthalate (PET), polyphenylene sulfide (PPS), polyallylate, polyimide (PI), cellulose triacetate (TAC), or cellulose acetate propionate (CAP).

Each of the first and second inorganic layers may be a barrier layer that prevents infiltration of external foreign materials, and thus may be a single layer or multiple layers including an inorganic material, such as SiNx and/or SiOx.

The substrate 100 including polymer resin may include an opening corresponding to the opening area RA, or may not include openings. However, as described above, the display element layer and the thin-film encapsulation layer 300 may include openings, respectively.

The display panel P includes a plurality of pixels arranged in the display area DA. Each of the pixels may include, for example, an OLED. Each of the pixels may emit, for example, red light, green light, blue light, or white light via the OLED.

A first non-display area NDA1 surrounds the opening area RA. The first non-display area NDA1 may be an area where a display element, such as an OLED that emits light, is not arranged. In a second non-display area NDA2, a scan driver that provides a scan signal to each of the pixels, a data driver that provides a data signal to each of the pixels, and a main power wire for providing first and second power supply voltages may be arranged.

A buffer layer 201 to prevent infiltration of impurities into a semiconductor layer of a thin film transistor (TFT) may be arranged on the substrate 100. The buffer layer 201 may include, for example, an inorganic insulating material, such as silicon nitride or silicon oxide, and may be a single layer or multiple layers including the inorganic insulating material. According to some embodiments, the second inorganic layer may be understood as a portion of the buffer layer 201 having a multi-layered structure.

A pixel circuit PC including a TFT and a storage capacitor Cst may be arranged on the buffer layer 201. The TFT may include a semiconductor layer ACT, a gate electrode GE, a source electrode SE, and a drain electrode DE. The TFT may be a driving TFT. According to the present example embodiment, the TFT is a top gate type in which the gate electrode GE is arranged on the semiconductor layer ACT with a gate insulating layer 203 therebetween. According to another example embodiment, the TFT may be a bottom gate type.

The semiconductor layer ACT may include, for example, polysilicon. In another example embodiment, the semiconductor layer ACT may include, for example, amorphous silicon, an oxide semiconductor, or an organic semiconductor. The gate electrode GE2 may include, for example, a low resistance metal material. The gate electrode GE may include, for example, a conductive material including, for example, molybdenum (Mo), aluminum (Al), copper (Cu), and titanium (Ti), and may be formed as a multi-layer or single layer including the aforementioned materials.

The gate insulating layer 203 may be interposed between the semiconductor layer ACT and the gate electrode GE and may include, for example, an inorganic insulating material, such as silicon oxide, silicon nitride, silicon oxynitride, aluminum oxide, titanium oxide, tantalum oxide, or hafnium oxide.

The source electrode SE and the drain electrode DE may include, for example, a highly conductive material. Each of the source electrode SE and the drain electrode DE may include, for example, a conductive material including Mo, Al, Cu, and/or Ti, and may be a multi-layer or single layer including the aforementioned materials. According to an example embodiment, each of the source electrode SE and the drain electrode DE may be formed as a multi-layer of Ti/Al/Ti.

The storage capacitor Cst includes a lower electrode CE1 and an upper electrode CE2 with a first interlayer insulating layer 205 therebetween. The lower electrode CE1 and the upper electrode CE2 overlap each other. The storage capacitor Cst may be overlapped with the TFT. FIG. 6 illustrates a case where the gate electrode GE of the TFT is the lower electrode CE1 of the storage capacitor Cst, but the present disclosure is not limited thereto. According to another example embodiment, the storage capacitor Cst may not be overlapped with the TFT. The storage capacitor Cst may be covered with a second interlayer insulating layer 207.

The first and second interlayer insulating layers 205 and 207 may include, for example, an inorganic insulating material, such as silicon oxide, silicon nitride, silicon oxynitride, aluminum oxide, titanium oxide, tantalum oxide, or hafnium oxide.

The pixel circuit PC including the TFT and the storage capacitor Cst may be covered with a first insulating layer 209. The first insulating layer 209 may serve as a planarization insulating layer, and may include, for example, an organic insulating material, such as a polymer (such as polymethyl methacrylate (PMMA) or polystyrene (PS)), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like. According to an example embodiment, the first insulating layer 209 may include polyimide. According to an example embodiment, the first insulating layer 209 may have a thickness of about 1.7 μm to about 2.4 μm.

The OLED may be disposed on the first insulating layer 209. A pixel electrode 221 of the OLED may be arranged on the first insulating layer 209 and may be connected to the pixel circuit PC via a contact hole of the first insulating layer 209.

The pixel electrode 221 may include conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). According to another example embodiment, the pixel electrode 221 may include, for example, a reflection layer including silver (Ag), magnesium (Mg), aluminum (Al), platinum (Pt), palladium (Pd), gold (Au), nickel (Ni), neodymium (Nd), iridium (Ir), chromium (Cr), or a compound of these materials. According to another example embodiment, the pixel electrode 221 may further include, for example, a film formed of ITO, IZO, ZnO, or $In_2O_3$ above/below the reflection layer.

A second insulating layer 211 includes an opening via which an upper surface of the pixel electrode 221 is exposed, and covers an edge of the pixel electrode 221. The second insulating layer 211 may include, for example, an inorganic insulating material. For example, the second insulating layer 211 may include silicon oxide and/or silicon nitride and may be a single layer or a multi-layer. A thickness of the second insulating layer 211 may be less than that of the first insulating layer 209.

An intermediate layer 222 may include an emission layer. The emission layer may include, for example, a low molecular or high molecular organic material that emits light of a certain color. According to an example embodiment, as shown in FIG. 7, the intermediate layer 222 may further include a first functional layer 222A arranged below an emission layer 222B, and/or a second functional layer 222C arranged above the emission layer 222B.

The first functional layer 222A may be a single layer or a multi-layer. For example, when the first functional layer 222A is formed of a high molecular weight material, the first functional layer 222A is a hole transport layer (HTL) having a single-layer structure, and may be formed of poly-(3,4)-ethylene-dihydroxy thiophene (PEDOT) or polyaniline (PANI). On the other hand, when the first functional layer 222A is formed of a low molecular weight material, the first functional layer 222A may include a hole injection (HIL) and an HTL.

When the first functional layer 222A and the emission layer 222B are formed of high molecular weight materials, the second functional layer 222C may be formed to improve the characteristics of the OLED. The second functional layer 222C may be a single layer or a multi-layer. The second functional layer 222C may include an electron transport layer (ETL), and/or an electron injection layer (EIL).

Some of a plurality of layers that constitute the intermediate layer 222, for example, the first and second functional layers 222A and 222C, may be arranged not only in the display area DA but also in the first non-display area NDA1.

An opposite electrode 223 may be arranged to face the pixel electrode 221, with the intermediate layer 222 therebetween. The opposite electrode 223 may be formed of a conductive material having a low work function. For example, the opposite electrode 223 may include a (semi) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) or an alloy of these materials. In another example embodiment, the opposite electrode 223 may further include a layer, such as ITO, IZO, ZnO, or $In_2O_3$, on the (semi)transparent layer including any of the above-described materials. The opposite electrode 223 may be arranged not only in the display area DA but also in the first non-display area NDA1. According to another example embodiment, the opposite electrode 223 may be arranged only in the display area DA. For convenience of description, a case where the opposite electrode 223 is arranged only in the display area DA will now be described in detail.

The OLED may be covered with the thin-film encapsulation layer 300. The thin-film encapsulation layer 300 may include at least one organic encapsulation layer and at least one inorganic encapsulation layer. Although the thin-film encapsulation layer 300 as shown includes first and second inorganic encapsulation layers 310 and 330 and an organic encapsulation layer 320 therebetween in FIG. 6, a stacking order of the first and second inorganic encapsulation layers 310 and 330 and the organic encapsulation layer 320 and the numbers of inorganic encapsulation layers and organic encapsulation layers may be changed.

The first and second inorganic encapsulation layers 310 and 330 may include, for example, an inorganic insulating material of at least one of aluminum oxide, titanium oxide, tantalum oxide, hafnium oxide, zinc oxide, silicon oxide, silicon nitride, and silicon oxynitride, and may be formed via chemical vapor deposition (CVD) or the like. The organic encapsulation layer 320 may include, for example, a polymer-based material. Examples of the polymer-based material include acrylic resin, epoxy resin, polyimide, and polyethylene.

Data lines DL may alternate with each other, with an insulating layer therebetween. Neighboring data lines DL may be arranged below and above the insulating layer (for example, the second interlayer insulating layer 207), respectively.

A display apparatus as described above may be manufactured by using the apparatus 1 and the method of manufacturing a display apparatus described above with reference to FIGS. 1 through 4.

For example, when at least one of the first and second functional layers 222A and 222C and the opposite electrode 223 is manufactured using an apparatus for manufacturing a display apparatus, the above-described mask assembly (40 of FIG. 1) may be used.

When the first and second functional layers 222A and 222C are formed, the deposition material may be deposited on the display substrate D via the mask assembly, as described above. In this case, the display substrate D may include the substrate 100, the buffer layer 201, the gate insulating layer 203, the first interlayer insulating layer 205, the TFT, the second interlayer insulating layer 207, the first insulating layer 209, the second insulating layer 211, and the pixel electrode 221. According to another example embodiment, the display substrate D may further include the first functional layer 222A and the emission layer 222B in addition to the above-described layers. In this case, at least one of the first functional layer 222A and the second functional layer 222C may be deposited via the above-described apparatus 1. For convenience of description, a case where the second functional layer 222C is formed on the display substrate D will now be described in detail.

When the second functional layer 222C is formed, the deposition material may be deposited on the display substrate D by using the mask assembly, as described above.

In this case, the second functional layer 222C may be blocked by a shielding portion and thus may not be formed in the opening area RA. According to another example embodiment, the second functional layer 222C may not be formed even in the first non-display area NDA1 surrounding the opening area RA, due to the shielding portion.

In the above-described case, a deposition material that has passed through an opening of a mask may be deposited in the display area DA except for the shielding portion, and thus the second functional layer 222C may be formed.

After the second functional layer 222C is formed as described above, the opposite electrode 223 may be formed on the second functional layer 222C. The opposite electrode 223 may be formed, similar to the formation of the second functional layer 222C. In this case, the first opening area RA1 not including the first functional layer 222A, the second functional layer 222C, and the opposite electrode 223 may be formed in the opening area RA.

Thereafter, the thin-film encapsulation layer 300 may be formed on the opposite electrode 223, thereby manufacturing the display panel P. In this case, at least a portion of the thin-film encapsulation layer 300 may be arranged on an inner surface of the first opening area RA1 and thus may shield at least a portion of the first opening area RA1.

Thereafter, the second opening area RA2 may be formed by irradiating a laser to the first opening area RA1 or mechanically abrading the first opening area RA1. In this way, the opening area RA may be completed. In this case, the second opening area RA2 may be formed to penetrate the substrate 100 and other layers.

According to another example embodiment, before the thin-film encapsulation layer 300 is formed, the second opening area RA2 may be formed by irradiating a laser to the first opening area RA1 or mechanically abrading the first opening area RA1. Next, the thin-film encapsulation layer 300 may be formed. In this case, at least a portion of the thin-film encapsulation layer 300 may be formed on the inner surface of the opening OP, and thus external moisture or oxygen may be prevented from infiltrating into each layer of the display panel P.

Accordingly, the display apparatus may minimize gas or a foreign material that is generated due to use of laser or the like during formation of the second opening area RA2, and thermal deformation of the first and second functional layers 222A and 222C due to application of heat thereto may be prevented.

Figure 8:
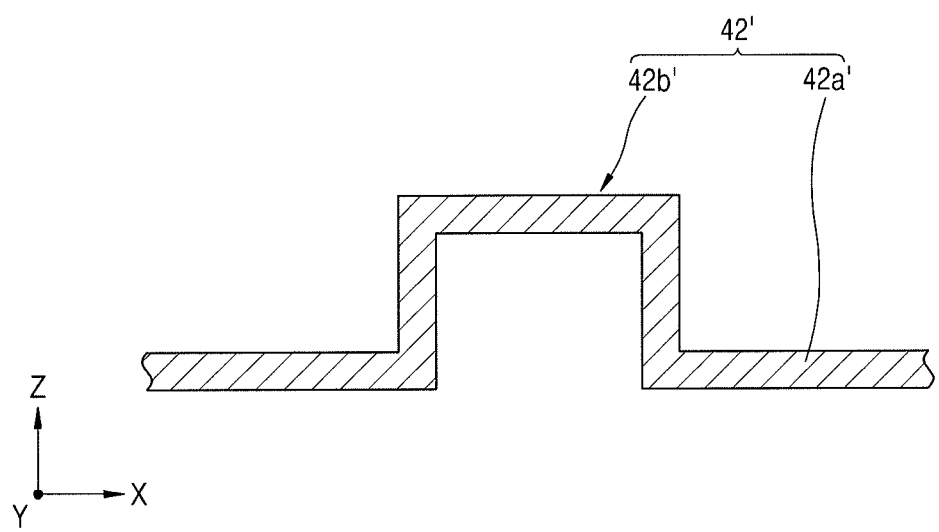
FIG. 8 illustrates a cross-sectional view of a stick of a mask assembly in an apparatus for manufacturing a display apparatus, according to another example embodiment.

FIG. 8 is a cross-sectional view of a stick of a mask assembly in an apparatus for manufacturing a display apparatus, according to another example embodiment.

Referring to FIG. 8, a description of an apparatus for manufacturing a display apparatus may be similar to that of the apparatus 1 of FIGS. 1 through 4. A description of a mask assembly is similar to that of the mask assembly 40 of FIGS. 1 through 4.

A stick 42' may be formed to have various shapes. The stick 42' may include a stick body portion 42a' and a protrusion 42b'. The stick body portion 42a' and the protrusion 42b' may be integrally formed with each other. In this case, after the stick body portion 42a' and the protrusion 42b' may be formed in a straight line, and then the straight line may be bent to form the protrusion 42b'. The stick body portion 42a' and the protrusion 42b' may be formed the same as or similar to descriptions given with reference to FIGS. 1 through 4.

Figure 9:
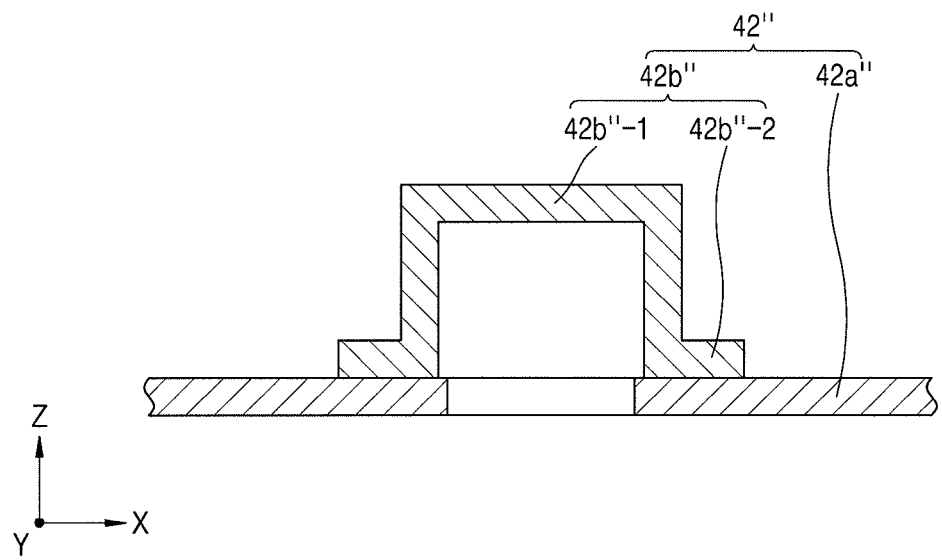
FIG. 9 illustrates a cross-sectional view of a stick of a mask assembly in an apparatus for manufacturing a display apparatus, according to another example embodiment.

FIG. 9 is a cross-sectional view of a stick of a mask assembly in an apparatus for manufacturing a display apparatus, according to another example embodiment.

Referring to FIG. 9, a description of an apparatus for manufacturing a display apparatus may be similar to that of the apparatus 1 of FIGS. 1 through 4. A description of a mask assembly may be similar to that of the mask assembly 40 of FIGS. 1 through 4.

A stick 42" may include a stick body portion 42a" and a protrusion 42b". The stick body portion 42a" and the protrusion 42b" may be formed to be separated from each other. The protrusions 42b" may be arranged on one side of the stick body portion 42a" that faces the display substrate D. In this case, the protrusion 42b" may protrude from the stick body portion 42a" toward the display substrate D. For example, a width of a connection portion 42b"-2 of the protrusion 42b" may be less than that of a shielding portion 42b"-1 of the protrusion 42b". A width of the stick body portion 42a" may also be less than that of the shielding portion 42b"-1. The width of the stick body portion 42a" and that of the connection portion 42b"-2 may be equal to each other. The width of the connection portion 42b"-2 may be measured in a Y-axis direction of FIG. 8, the width of the stick body portion 42a" may be measured in an X-axis direction of FIG. 8, and the width of the shielding portion 42b"-1 may be measured in the X-axis or Y-axis direction of FIG. 9. The stick body portion 42a" and the protrusion 42b" may be similar to those described above with reference to FIGS. 1 through 4.

Figure 10:
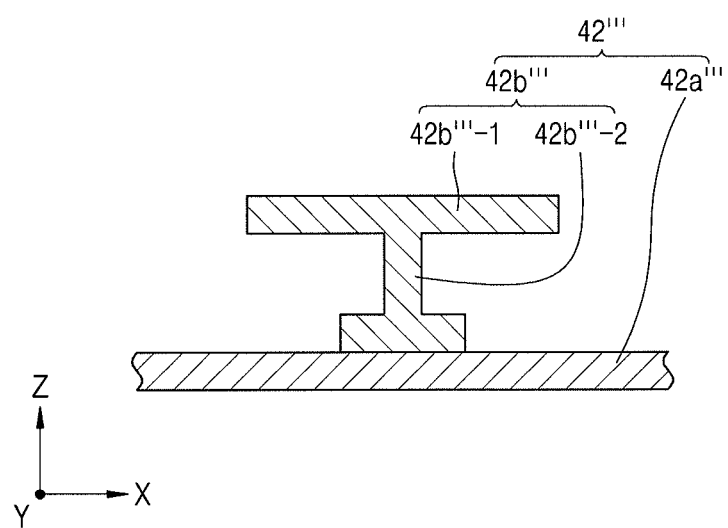
FIG. 10 illustrates a cross-sectional view of a stick of a mask assembly in an apparatus for manufacturing a display apparatus, according to another example embodiment.

FIG. 10 is a cross-sectional view of a stick of a mask assembly in an apparatus for manufacturing a display apparatus, according to another example embodiment.

Referring to FIG. 10, a description of an apparatus for manufacturing a display apparatus may be similar to that of the apparatus 1 of FIGS. 1 through 4. A description of a mask assembly may be similar to that of the mask assembly 40 of FIGS. 1 through 4.

A stick 42''' may include a stick body portion 42a''' and a protrusion 42b'''. The stick body portion 42a''' and the protrusion 42b''' may be separated from each other or may be integrally formed with each other. When the stick body portion 42a''' and the protrusion 42b''' are integrally formed with each other, they may be manufactured by processing a base member via, for example, etching or the like. According to another example embodiment, when the stick body portion 42a''' and the protrusion 42b''' are formed to be separated from each other, they may be manufactured independently and may be connected to each other via, for example, welding or the like.

The protrusion 42b''' may include a connection portion 42b'''-2 and a shielding portion 42b'''-1. The connection portion 42b'''-2 may be formed to have an H shape. In this case, the connection portion 42b'''-2 may be connected to a center of the shielding portion 42b'''-1 to thereby connect the shielding portion 42b'''-1 to the stick body portion 42a'''. The shielding portion 42b'''-1 may be formed to have various shapes. In this case, as described above, the shielding portion 42b'''-1 may have various shapes according to the shape of an opening area to be formed.

By way of summation and review, to increase the area occupied by a display area and also add various functions, a display apparatus may be formed to have an opening in a display area. In display apparatuses including openings, when a laser or mechanical abrasion is used to form an opening after formation of each layer, gas or a foreign material may be generated during removal of some layers. For example, during formation of the hole, a foreign material may be generated or excessive energy may be used. Accordingly, an organic light-emitting device around the hole may be damaged. As described above, embodiments may provide for forming a display apparatus including an opening while minimizing generation of gas or a foreign material.

According to embodiments, various electronic elements may be arranged by including an opening.

According to embodiments, generation of gas or foreign materials during formation of the opening may be minimized.

According to embodiments, the opening may be formed via a simple structure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A mask assembly, comprising:
a mask frame;
a mask on the mask frame and having an opening through which a deposition material can pass; and
a stick on the mask frame and extending over the opening, the stick including:
a stick body portion connected to the mask frame and extending over the opening; and
a protrusion protruding from the stick body portion toward the opening, an end of the protrusion being configured to extend through the opening of the mask.

2. The mask assembly as claimed in claim 1, wherein the stick body portion and the protrusion are separable from each other.

3. The mask assembly as claimed in claim 1, wherein the protrusion includes:
a connection portion connected to the stick body portion; and
a shielding portion connected to the connection portion and configured to shield the deposition material.

4. The mask assembly as claimed in claim 1, wherein the end of the protrusion is arranged farther from a source, which is configured to spray the deposition material, than one side of the mask that faces the source.

5. The mask assembly as claimed in claim 1, wherein the mask and at least a portion of the stick include different materials from each other.

6. The mask assembly as claimed in claim 1, wherein at least a portion of the stick is a non-magnetic material.

7. The mask assembly as claimed in claim 1, wherein a hole is in a portion of the stick body portion that corresponds to the protrusion.

8. The mask assembly as claimed in claim 1, wherein the mask frame, the stick, and the mask are sequentially stacked.

9. An apparatus for manufacturing a display apparatus, the apparatus comprising:
a chamber to accommodate a display substrate;
a mask assembly positioned to face the display substrate; and
a source facing the mask assembly and configured to supply a deposition material to the display substrate, wherein:
the mask assembly includes:
a mask frame;
a mask on the mask frame and having an opening through which the deposition material can pass; and
a stick on the mask frame and extending over the opening, and the stick includes:
a stick body portion connected to the mask frame and extending over the opening; and
a protrusion protruding from the stick body portion toward the opening, an end of the protrusion being configured to extend through the opening of the mask.

10. The apparatus as claimed in claim 9, wherein the stick body portion and the protrusion are separable from each other.

11. The apparatus as claimed in claim 9, wherein the protrusion includes:
a connection portion connected to the stick body portion; and
a shielding portion connected to the connection portion and configured to shield the deposition material.

12. The apparatus as claimed in claim 9, wherein the end of the protrusion is arranged farther from the source, which is configured to spray the deposition material, than one side of the mask that faces the source.

13. The apparatus as claimed in claim 9, wherein the mask and at least a portion of the stick include different materials from each other.

14. The apparatus as claimed in claim 9, wherein at least a portion of the stick is a non-magnetic material.

15. The apparatus as claimed in claim 9, wherein a hole is in a portion of the stick body portion that corresponds to the protrusion.

16. The apparatus as claimed in claim 9, wherein the mask frame, the stick, and the mask are sequentially stacked.

17. A method of manufacturing a display apparatus, the method comprising:
- arranging a display substrate and a mask assembly within a chamber;
- aligning the display substrate with the mask assembly; and
- supplying a deposition material from a source, passing the deposition material through the mask assembly, and supplying the deposition material to the display substrate,
- wherein the deposition material is blocked by a certain area while passing through an opening of the mask assembly to form an opening area in the display substrate, and is deposited on a display area of the display substrate except for the opening area,
- wherein the mask assembly includes:
  - a mask frame;
  - a mask on the mask frame and having the opening; and
  - a stick on the mask frame and extending over the opening, the stick including:
    - a stick body portion connected to the mask frame and extending over the opening; and
    - a protrusion protruding from the stick body portion toward the opening, an end of the protrusion being configured to extend through the opening of the mask.

18. The method as claimed in claim 17, wherein the protrusion corresponds to the opening area and protrudes toward the display substrate.

19. The method as claimed in claim 18, wherein the protrusion is in contact with the display substrate.

20. The method as claimed in claim 17, wherein the deposition material forms at least one of:
- at least a portion of an intermediate layer of the display substrate; and
- an opposite electrode.

21. A method of manufacturing a display apparatus, the method comprising:
- arranging a display substrate and a mask assembly within a chamber;
- aligning the display substrate with the mask assembly; and
- supplying a deposition material from a source, passing the deposition material through the mask assembly, and supplying the deposition material to the display substrate, wherein:
- the mask assembly includes:
  - a mask frame;
  - a mask on the mask frame and having an opening through which the deposition material passes; and
  - a stick on the mask frame and extending over the opening, and the stick includes:
    - a stick body portion connected to the mask frame and extending over the opening; and
    - a protrusion protruding from the stick body portion toward the opening, an end of the protrusion being configured to extend through the opening of the mask.

22. The method as claimed in claim 21, wherein the end of the protrusion is arranged farther from the source than one side of the mask that faces the source.

23. The method as claimed in claim 21, wherein the mask and at least a portion of the stick include different materials.

24. The method as claimed in claim 21, wherein at least a portion of the stick is a non-magnetic material.

* * * * *